(12) United States Patent
Terasawa

(10) Patent No.: US 6,215,634 B1
(45) Date of Patent: Apr. 10, 2001

(54) DRIVE CIRCUIT FOR POWER DEVICE

(75) Inventor: Noriho Terasawa, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/289,200

(22) Filed: Apr. 10, 1999

(30) Foreign Application Priority Data

Apr. 10, 1998 (JP) ................................................ 10-099027

(51) Int. Cl.[7] ............................................. H02H 3/00
(52) U.S. Cl. ...................... 361/100; 361/93.1; 327/310
(58) Field of Search ...................... 361/88, 93.1, 100, 361/101, 110, 111; 327/306, 310

(56) References Cited

U.S. PATENT DOCUMENTS 5,436,487 * 7/1995 Narita .................................... 257/378
5,483,404 1/1996 Nakano .................................. 361/18

FOREIGN PATENT DOCUMENTS

| 0827266A2 | 3/1998 | (EP) . |
| 2140997A | 12/1984 | (GB) . |
| 2252213A | 7/1992 | (GB) . |
| 2258357A | 2/1993 | (GB) . |
| 5275999 | 10/1993 | (JP) . |
| 6152354 | 5/1994 | (JP) . |
| 7297695 | 11/1995 | (JP) . |

* cited by examiner

Primary Examiner—Michael J. Sherry
Assistant Examiner—Kim Huynh
(74) Attorney, Agent, or Firm—Rossi & Associates

(57) ABSTRACT

A drive circuit for driving a power device is provided which includes a first ground that provides a current path of drive current that flows when the power device is driven, and a second ground that is used by a protection circuit that monitors an operating state of the power device.

6 Claims, 8 Drawing Sheets

DRIVE CIRCUIT FOR POWER DEVICE

FIELD OF THE INVENTION

The present invention relates to drive circuits for power devices, and in particular to drive circuits for power devices that prevent protection circuits for monitoring operating states of the power devices, from performing unstable operations due to influences of inductances present in wires connecting the drive circuits with the power devices.

BACKGROUND OF THE INVENTION

In conventional large-capacity inverters for driving industrial motors, thyristors that can easily provide a high breakdown voltage and allow flow of large current were used as switching devices. In middle- or small-capacity inverters, bipolar junction transistors were mainly used as switching devices. Later, IGBT (Insulated Gate Bipolar Transistor) has been used which exhibits both a high input impedance characteristic peculiar to MOSFET (Metal Oxide Semiconductor Field Effect Transistor) and a low saturation-voltage characteristic peculiar to bipolar transistors. In recent years, the IGBT has been developed so as to provide a higher breakdown voltage and a larger current capacity, and are now employed in the field of thyristors. Because of a high current value to be handled by the IGBT, it is essential to protect the IGBT against overcurrent and overheat. Generally, drive circuits for driving these power devices are provided with overcurrent protection and overheat protection functions.

FIG. 5 is a circuit diagram showing a known drive circuit for an IGBT, which incorporates protection networks. In FIG. 5, an IGBT chip 100, a flywheel diode 200 and a drive circuit 300 are illustrated. The IGBT chip 100 principally consists of an IGBT 101, and a temperature detection diode 102 that is embedded in the chip and serves as a temperature sensor for detecting the junction temperature of the IGBT 101. The collector of the IGBT 101 is connected to the cathode of the flywheel diode 200, and the emitter is connected to the anode of the flywheel diode 200.

The drive circuit 300 includes a gate control unit 301 that is connected to the gate of the IGBT 101 and serves to control turn-on and turn-off of the IGBT 101, a comparator 302 for determining overcurrent or excess current of the IGBT 101, and a comparator 303 for determining excessively high temperature or overheat of the device. The comparator 302 has a non-inverting input terminal to which a junction between the sense emitter of the IGBT 101 and a resistor 304 is connected, and an inverting input terminal to which a reference voltage source 305 is connected. The comparator 303 has a non-inverting input terminal to which a reference voltage source 306 is connected, and an inverting input terminal to which a junction between a constant-current source 307 and the anode of the temperature detection diode 102 is connected.

The emitter of the IGBT 101, cathode of the temperature detection diode 102, negative terminals of the reference voltage sources 305, 306, and the resistor 304 are connected to the ground terminal (GND) of the drive circuit 300. An inductance L101 between the constant-current source 307 and the temperature detection diode 102, inductance L102 between the gate control unit 301 and the gate terminal of the IGBT 101, inductance L103 between the sense emitter of the IGBT 101 and the comparator 302, inductances L104, L105, L106, L107 on the ground GND represent inductances of internal wires.

In an overcurrent protection circuit of the IGBT 101, part of the emitter current of the IGBT 101 is taken out from the sense emitter, so that the sense emitter current flows through the resistor 304. The comparator 302 compares the terminal voltage that is produced across the resistor 304 due to the sense emitter current, with the voltage of the reference voltage source 305, and determines that overcurrent flows through the IGBT 101 when the terminal voltage of the resistor 304 due to the sense emitter current becomes higher than the voltage of the reference voltage source 305. In an overheat protection circuit of the IGBT 101, on the other hand, the comparator 303 compares the forward voltage of the temperature detection diode 102 through which a constant current flows from the constant-current source 307, with the voltage of the reference voltage source 306, and determines that the IGBT 101 is overheated when the forward voltage of the temperature detection diode 102 becomes lower than the voltage of the reference voltage source 306.

The IGBT 101 is turned on or off under control of the gate control unit 301 of the drive circuit 300. The portion of the IGBT 101 between the gate and the emitter behaves like a capacitor. Upon turn-on of the IGBT 101, therefore, the drive current charges the capacitor between the gate and the emitter, and flows from the gate to a negative terminal of a power supply (not shown), through the emitter and the ground GND. Upon turn-off, the charge stored between the gate and the emitter is discharged, and the discharge current flows from the gate to the emitter of the IGBT 101, through the gate control unit 301 and the ground GND. The drive current that flows upon turn-on and turn-off of the IGBT 101 is transient, and has a considerably large value on the order of ampere (A).

A plurality of sets or combinations each consisting of the drive circuit 300, IGBT 100 and the flywheel diode 200 as described above may be arranged in parallel with each other, along with a single direct-current power supply. In the case of a bridge circuit that use N-channel power devices to provide a polyphase inverter, for example, circuits for driving negative-side power devices may use a common direct-current power supply. In the case of a bridge circuit that use P-channel power devices to provide a polyphase inverter, circuits for driving positive-side power devices may use a common direct-current power supply. The following example illustrates two drive circuits corresponding to two phases on the negative side of a bridge circuit that uses N-channel power devices to provide a three-phase inverter.

FIG. 6 is a view showing an example of connection of two drive circuits that share a single power supply. In FIG. 6, the same reference numerals as used in FIG. 5 are used for identifying the corresponding constituent elements, of which no detailed description will be provided. For the sake of brevity, the circuits for overcurrent protection and overheat protection are not illustrated in FIG. 6 nor explained in the following description.

The gate of the IGBT 101 is connected to the drive circuit 300, and the collector is connected to a load terminal V, while the emitter is connected to a load terminal N. In internal wires through which the main current of the IGBT 101 flows between the load terminal V and the load terminal N, an inductance 108 exists on the side of the collector of the IGBT 101, and an interphase inductance 109 exists between the emitter of the IGBT 101 and the emitter of the adjacent IGBT 101a, while an inductance L110 exists between the emitter of the IGBT 101a and the load terminal N. The drive circuit 300 is connected to the positive and negative terminals of a dc power supply 400, and inductances L104, L105, L106, L107 exist in an internal wire that extends from the ground GND to the negative terminal of the dc power supply 400. Similarly, IGBT 101a and drive circuit 300a are provided in the circuit for another phase as shown in the lower part of FIG. 6, and the same dc power supply 400 as used for the drive circuit 300 is connected to the drive circuit 300a. Also, inductances L104a, L105a, L106a, and L107a exist in an internal wire on the ground GND of the drive circuit 300a.

When the upper drive circuit 300 supplies drive current to the IGBT 101, the IGBT 101 is turned on, and load current $I_{ON}$ flows from the load terminal V to the load terminal N, through the inductances L108, IGBT 101, and the inductances L109, L110. Similarly, when the lower drive circuit 300a supplies drive current to the IGBT 101a, the IGBT 101a is turned on, and load current flows from the load terminal U to the load terminal N, through the IGBT 101a. In this manner, two IGBT switching circuits that use the common dc power supply 400 operate independently of each other.

In the circuit as shown in FIG. 5, however, transient drive current flows upon turn-on and turn-off of the IGBT 101, and transient voltages are produced across the inductances L102, L104, L105, L106, L107 of the internal wires on the current loop. The transient voltages cause variations in the operating points of the protection circuits, which may result in malfunction of the protection circuits. The mechanism that causes the malfunction will be described below in detail.

FIG. 7 is a view useful in explaining flow of drive current upon turn-on of the IGBT 101, and FIG. 8 is a view useful in explaining flow of drive current upon turn-off. When the IGBT 101 is turned on upon application of a voltage to between the gate and the emitter thereof, charging current that provides drive current $I_{DON}$ transiently flows into a capacitor that is assumed to be present between the gate and the emitter, as shown in FIG. 7. At this time, the drive current $I_{DON}$ causes a transient voltage to be produced across each of the inductances L104, L105, L106, L107 on the path through which the drive current $I_{DON}$ flows, in particular, those inductances that exist on the ground GND that provides a reference potential for the overcurrent protection circuit and overheat protection circuit. With respect to the overcurrent protection circuit, for example, if a transient voltage is produced across the inductance L106 on the ground GND due to flow of the drive current $I_{DON}$, the potential of the negative terminal of the reference voltage source 305 becomes lower than the potential on the ground side of the resistor 304, by an amount corresponding to the transient voltage, and the voltage of the reference voltage source 305 is substantially reduced by the amount corresponding to the transient voltage. As a result, the operating point of the comparator 302 is changed, and the overcurrent protection circuit may fail to perform appropriate protecting operations, or may malfunction during normal operations. In the overheat protection circuit, too, if the drive current $I_{DON}$ causes a transient voltage to be produced across the inductance L104 on the ground GND, the transient voltage substantially reduces the voltage of the reference voltage source 306 in a similar manner, resulting in a change in the operating point of the comparator 303. Consequently, the overheat protection circuit may fail to perform proper protecting operations. Upon turn-off of the IGBT 101, on the other hand, charge stored between the gate and the emitter is discharged, and discharge current provides drive current $I_{DOFF}$, which transiently flows through the inductances L102, L107, L106, L105, L104, as shown in FIG. 8. In this case, too, a transient voltage appears across the inductance L106 on the ground GND, and the potential of the negative terminal of the reference voltage source 305 becomes higher than the potential of the ground side of the resistor 304 by an amount corresponding to the transient voltage. As a result, the voltage of the reference voltage source 305 is substantially increased by the amount corresponding to the transient voltage, and the operating point of the comparator 302 is changed. At the same time, a transient voltage is produced across the inductance L104, which results in a substantial increase in the voltage of the reference voltage source 306, and a change in the operating point of the comparator 303. Thus, upon either turn-on or turn-off of the IGBT 101, the protection circuits cannot perform normal protecting operations.

In the circuit arrangement as shown in FIG. 6, when load current $I_{ON}$ flows from the load terminal V to the load terminal N upon turn-on of the IGBT 101, for example, a transient voltage is produced across each of the inductances L108, L109, L110. In particular, the transient voltage produced across the inductance L109 causes transient circulation current $I_{LOOP}$ to flow from the inductance L109 through a loop circuit that includes the inductances L104, L105, L106, L107 on the ground GND of the drive circuit 300 and the inductances L107a, L106a, L105a, L104a on the ground GND of the drive circuit 300a, and then return to the inductance L109. This transient circulation current $I_{LOOP}$ causes a transient voltage to be produced across each of the inductances L104, L105, L106, L107 and inductances L104a, L105a, L106a, L107a, and the transient voltages thus produced may cause changes in the reference voltage and detection voltage of the overcurrent protection circuit, or the reference voltage of the overheat protection circuit. Thus, the protection circuits may fail to perform normal protecting operations, or may malfunction during normal operations. Upon turn-off of the IGBT 101, too, a negative transient voltage is produced across the inductance L109 due to a reduction in the load current $I_{ON}$, and reverse circulation current—$I_{LOOP}$ flows through the loop circuit as indicated above, whereby different potentials appear at different locations on the common ground GND in the drive circuits, thus causing malfunction of the protection circuits.

SUMMARY OF THE INVENTION

It is therefore an object of the present invention to provide a drive circuit for a power device, wherein protection circuits that operate with very small current are prevented from malfunctioning because of transient voltages produced due to flow of large current through inductances that are distributed along a common wire.

To accomplish the above object, the present invention provides a drive circuit for driving a power device, comprising: a first ground that provides a current path of drive current that flows when the power device is driven; and a second ground that is used by a protection circuit that monitors an operating state of the power device.

In the drive circuit for the power device as described above, the second ground used by the protection circuit is provided independently of the first ground through which the drive current of the power device flows. Accordingly, while transient voltages are produced across inductances that are distributed on the first ground, during flow of transient drive current, such transient current is kept from flowing through the second ground. Since the drive current has no influence on the protection circuit built on the second ground, the protection circuit is free from malfunction, thus assuring stable protecting operations.

BRIEF DESCRIPTION OF THE DRAWINGS

The invention will be described in greater detail with reference to preferred embodiments thereof and the accompanying drawings, wherein.

DETAILED DESCRIPTION OF THE PREFERRED EMBODIMENTS

One preferred embodiment of the present invention when it is applied to a three-phase inverter will be described in detail with reference to the drawings.

Figure 1:
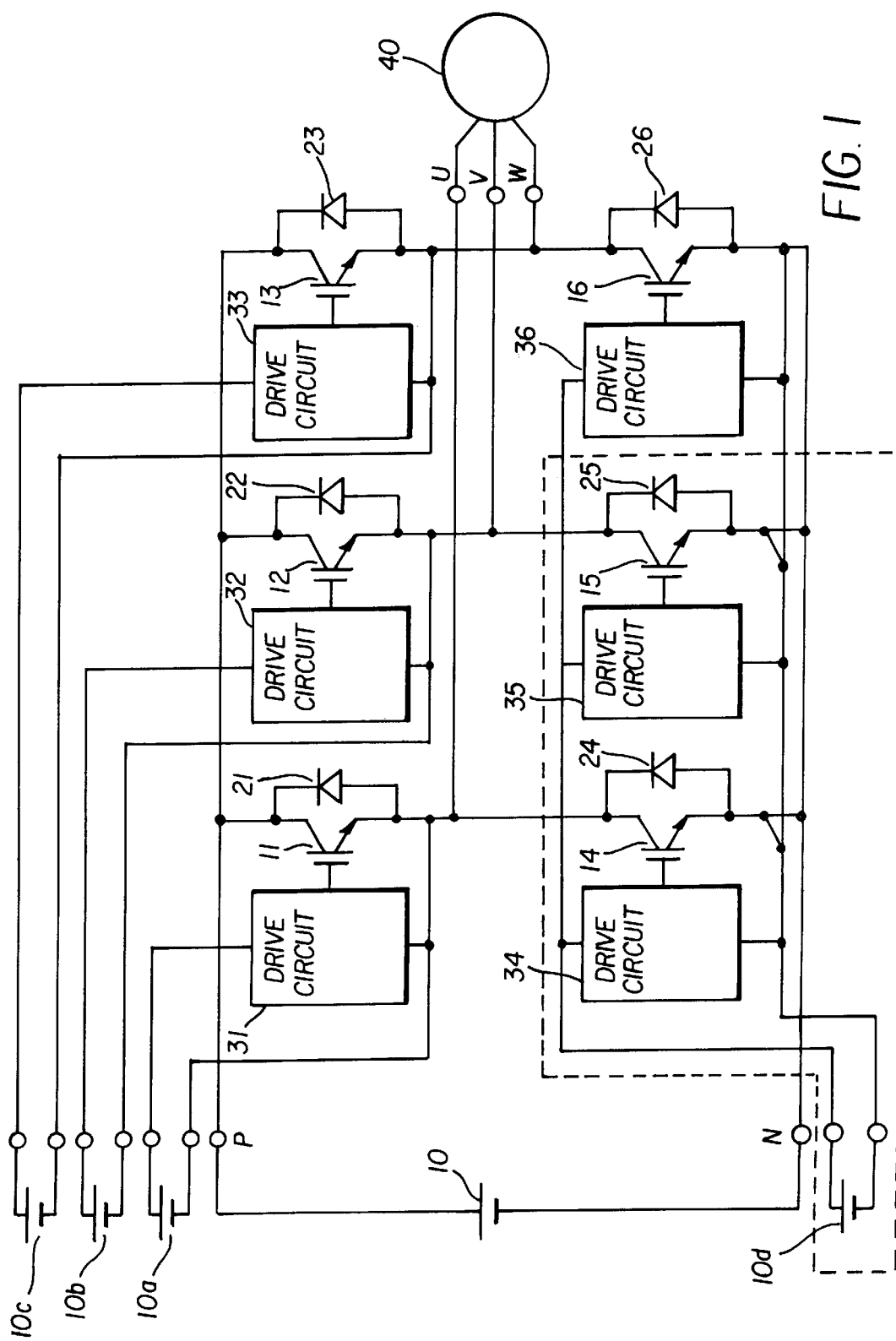
FIG. 1 is a view showing an inverter circuit as one embodiment of the present invention.

FIG. 1 is a view showing the configuration of an inverter circuit to which the present invention is applied. In FIG. 1, a dc power supply 10 of a main circuit is illustrated, and its positive electrode is connected to a terminal P, while its negative electrode is connected to a terminal N. Also, dc power supplies 10a, 10b, 10c, 10d for drive circuits are provided in addition to the dc power supply 10. The inverter circuit includes six N channel IGBTs 11, 12, . . . , 16, six flywheel diodes 21, 22, . . . , 26, and six drive circuits 31, 32, . . . , 36. The outputs of the drive circuits 31, 32, . . . , 36 are respectively connected to the gates of the IGBTs 11, 12, . . . , 16. The collector and emitter of each of the IGBTs 11, 12, . . . , 16 are connected to the cathode and anode, respectively, of a corresponding one of the flywheel diodes 21, 22, . . . , 26. The emitters of the three IGBTs 11, 12, 13 shown in the upper half of FIG. 1 are respectively connected to the collectors of the three IGBTs 14, 15, 16 shown in the lower half of FIG. 1, and connecting points between the corresponding emitters and collectors of these IGBTs are respectively connected to terminals U, V, W that are three-phase ac output terminals. These terminals U, V, W are connected to an ac motor 40.

Here, the terminal P of the dc power supply 10 is connected to the collector of each of the three IGBT 11, 12, 13 located on the positive side, and the terminal N of the dc power supply 10 is connected to the emitter of each of the three IGBTs 14, 15, 16 located on the negative side. Also, the three drive circuits 31, 32, 33 located on the side of the positive terminal P are respectively connected to exclusive dc power supplies 10a, 10b, 10c, and the negative terminals of the dc power supplies 10a, 10b, 10c are respectively connected to the emitters of the IGBTs 11, 12, 13. On the other hand, the three drive circuits 34, 35, 36 located on the negative terminal N are connected to a single dc power supply 10d, such that the drive circuits 34, 35, 36 share the dc power supply 10d.

In the above-described arrangement, each of the IGBTs 11, 12, . . . , 16 is combined with a corresponding one of the flywheel diodes 21, 22, 26 to provide an IGBT module, and the IGBT module is combined with a corresponding one of the drive circuits, to thus provide one inverter circuit. It is, however, possible to construct an inverter circuit by using six IGBT-IPM (Intelligent Power Module) each including one IGBT and one drive circuit that are integrated with each other within one module, or construct an inverter circuit by using three IGBT-IPM in each of which a circuit corresponding to one phase, including, for example, IGBT 11, 14, flywheel diodes 21, 24 and the drive circuits 31, 34, is integrated within one module. Needless to say, the inverter circuit may be constructed using one IGBT-IPM in which are integrated all circuits except for the dc power supplies 10, 10a, 10b, 10c, 10d of FIG. 1 and ac motor 40.

Next, the IGBTs and the drive circuits will be described in detail. Since each drive circuit 31, 32, . . . , 36 has substantially the same configuration, only the drive circuit 36 of the last pair will be described herein.

Figure 2:
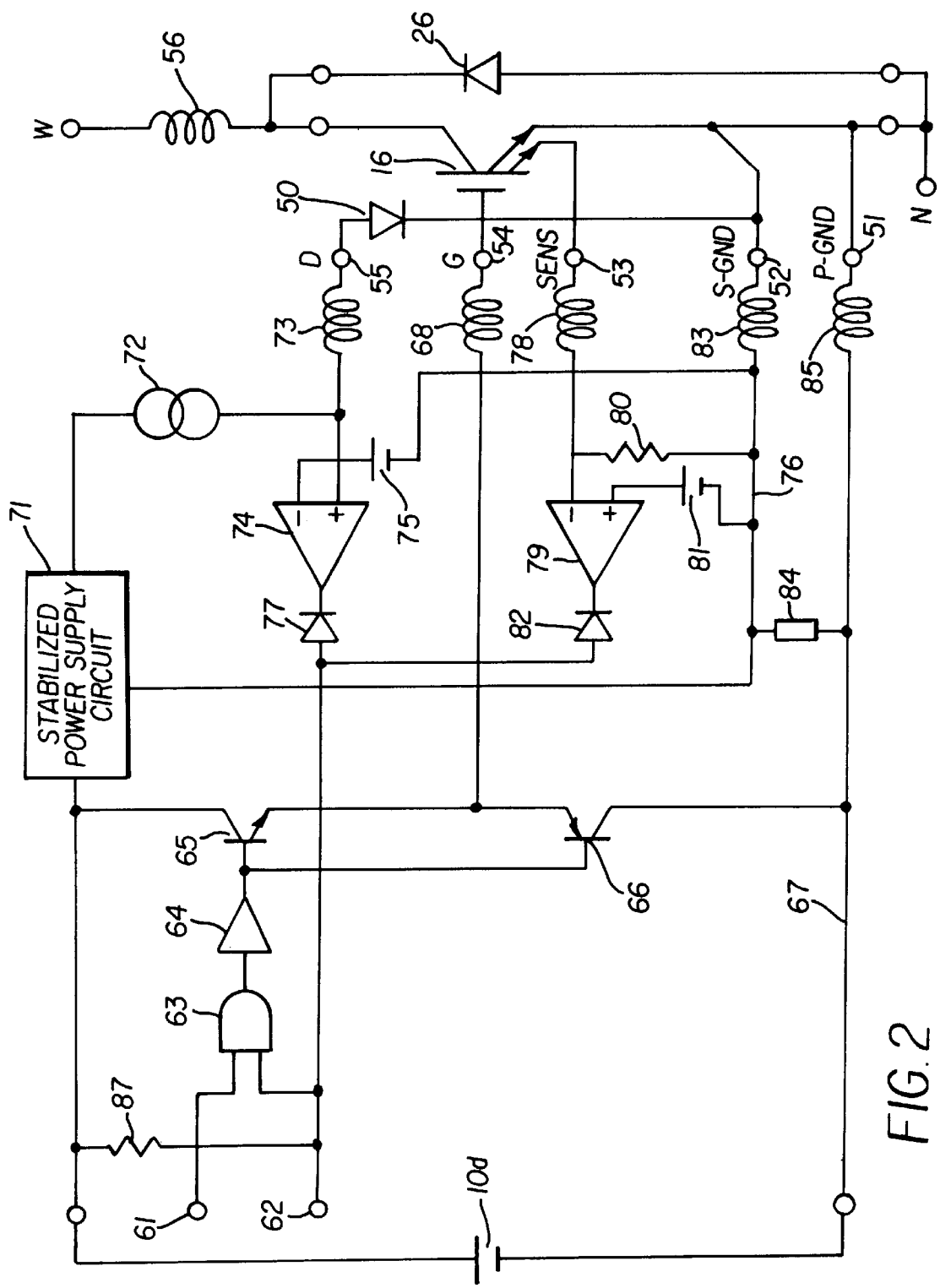
FIG. 2 is a circuit diagram showing a drive circuit constructed according to the present invention.

FIG. 2 is a circuit diagram showing the drive circuit according to the present invention. In FIG. 2, the IGBT chip includes an IGBT 16 and a temperature detection diode 50, and has five terminals on the side of the drive circuit, i.e., a power ground (P-GND) terminal connected to the emitter of the IGBT 16, sense ground (S-GND) terminal connected to a part of the emitter and the cathode of the temperature detection diode 50, sense emitter (SENS) terminal 53, gate (G) terminal 54, and a diode feed (D) terminal 55. On the side of the main current of the IGBT 16, the collector is connected to the terminal W through an inductance 56 of an internal wire, and the cathode and anode of the flywheel diode 26 are connected to the collector and emitter, respectively.

The drive circuit has an input terminal 61 that receives a switching signal, and an alarm output terminal 62. To the input terminal 61 is connected a first input of an AND gate 63. The output of the AND gate 63 is connected, via a predriver 64, to the bases of two transistors 65, 66 that constitute a complementary circuit. The collector of the transistor 65 is connected to the positive terminal of the dc power supply 10d, and the emitter is connected to the emitter of the transistor 66. The collector of (lie transistor 66 is connected to a power ground 67 that is connected to the negative terminal of the dc power supply 10d. The emitters of the transistors 65, 66 are connected to the gate of the IGBT 16, through an inductance 68 of an internal wire.

A stabilized power supply circuit 71 is connected to the positive terminal of the dc power supply 10d, and the stabilized output of the circuit 71 is connected to a constant current source 72. The output of the constant current source 72 is connected to the anode of the temperature detection circuit 50, through an inductance 73 of an internal wire, and also connected to the non-inverting input terminal of a comparator 74. The positive terminal of a reference voltage source 75 is connected to the inverting input terminal of the comparator 74, and the negative terminal of the voltage source 75 is connected to a sense ground 76 that is connected to the S-GND terminal 52. The ground terminal of the stabilized power supply circuit 71 is also connected to the sense ground 76. The output of the comparator 74 is connected to the cathode of the diode 77.

The SENS terminal 53 is connected to the inverting input terminal of a comparator 79 and one terminal of a resistor 80, and the other terminal of the resistor 80 is connected to the sense ground 76. The positive terminal of a reference voltage source 81 is connected to the non-inverting input terminal of the comparator 70, and the negative terminal of the voltage source 81 is connected to the sense ground 76. The output of the comparator 79 is connected to the cathode of a diode 82. The sense ground 76 is connected to the S-GND terminal 52 through an inductance 83 of an internal wire. In a wiring pattern of the sense ground 76, its terminal end portion remote from the S-GND terminal 52 is connected to the power ground 67 connected to the P-GND terminal 51 at its position close to the dc power supply 10d, through an impedance, for example, a resistor 84 in this embodiment. On the power ground 67, an inductance 85 of an internal wire exists between the position connected to the resistor 84, and the P-GND terminal 51.

The anodes of the two diodes 77, 82 are connected to each other, and a connecting point or junction of these diodes 77, 82 is connected to a second input of the AND gate 63, and the alarm output terminal 62. Also, the alarm output terminal 62 is connected to the positive terminal of the dc power supply 10d, through a pull-up resistor 87.

To perform the overheat protecting function with the above-described circuit arrangement, the temperature detection diode 50 incorporated within the IGBT chip is driven by constant current supplied from the constant current source 72, and its forward voltage is monitored by the comparator 74. Namely, during a normal operation of the IGBT chip that is not in an overheated state, the forward voltage of the temperature detection diode 50 represents a certain voltage that depends upon the chip temperature. The voltage obtained in this non-overheated state is larger than the voltage of the reference voltage source 75, and therefore the output of the comparator 74 generates a high-level (H) signal, so that the diode 77 connected to the output is placed in a non-conducting state. At this time, since the potential of the anode of the diode 77 is kept at a high (H) level due to the pull-up resistor 87, a high-level (H) signal is fed to the alarm output terminal 62. Also, the second input of the AND gate 63 is also held at a high (H) level, and therefore a switching signal received by the input terminal 61 is supplied as it is to the predriver 64. If the IGBT chip turns into all overheated state, namely, if the IGBT chip becomes overheated, on the other hand, the forward voltage of the temperature detection diode 50 having a negative temperature coefficient decreases. When the forward voltage becomes smaller than the voltage of the reference voltage source 75, the output of the comparator 74 generates a low-level (L) signal, with the result that the diode 77 conducts, and the potential on the side of its anode turns into a low (L) level, whereby the alarm output terminal 62 generates an L-level alarm signal. At the same time, the second input of the AND gate 63 receives the L-level signal, and the output of the AND gate 63 is fixed to the L level, irrespective of the logic level of the first input of the gate 63, thus nulling the switching signal received by the input terminal 61.

To perform the overcurrent protecting function, sense emitter current shunt from the main current is caused to flow through the resistor 80, and overcurrent is detected by monitoring the terminal voltage across the resistor 80. Namely, while rated main current, i.e., main current in a nominal range, flows through the IGBT 16, the sense emitter current shunt from the main current is small, and the voltage received by the inverting input terminal of the comparator 79 is smaller than that of the reference voltage source 81, so that the comparator 79 generates a high-level (H) output signal. At this time, the diode 82 connected to the output of the comparator 79 is in the non-conducting state, and therefore the anode side of the diode 82 is held at the H level, whereby a high-level (H) signal is fed to the alarm output terminal 62. Since the second input of the AND gate 63 is also at the H level, the switching signal received by the input terminal 61 is supplied as it is to the predriver 64. If the IGBT chip is brought into an overcurrent state due to shorting of a load, for example, the terminal voltage across the resistor 80 is increased, and the comparator 79 generates a low-level (L) output signal when the terminal voltage exceeds the voltage of the reference voltage source 81. As a result, the diode 82 starts conducting, and the potential on the anode side of the diode 82 turns into a low (L) level, whereby a low-level (L) signal is fed to the alarm output terminal 62, which in turn generates al alarm signal. At the same time, the second input of the AND gate 63 receives the L-level signal, and the output of the AND gate 63 is fixed to the L level, irrespective of the logic level of the first input of the gate 63, thus nulling the switching signal received by the input terminal 61.

In both of the above protecting operations, while the IGBT 16 is not being in the overheat or overcurrent state, the switching signal received by the input terminal 61 is fed to the predriver 64. Here, when the switching signal is an ON signal having a high (H) level, the transistor 65 is turned off while the transistor 66 is turned off, and current supplied from the dc power supply 10d, or drive current, is supplied to the gate of the IGBT 16, so that the IGBT 16 is brought into an ON state. At this moment, the drive current flows through a path including the transistor 65, inductance 68, gate of the IGBT 16, emitter of the IGBT 16, and the inductance 85 of the power ground 67. Thus, upon turn-on of the IGBT 16, the drive current flows only through the power ground 67, without flowing through the sense ground 76. Further, the sense ground 76 is isolated from the power ground 67 by the resistor 84. Accordingly, even if a transient voltage is produced across the inductance 85 due to the flow of the drive current, the transient voltage thus produced has no influence on the sense ground 76, and causes no changes in the forward voltage of the temperature detection diode 50 and the reference voltages of the reference voltage sources 75, 81 that provide threshold values for the overheat and overcurrent protecting functions. Thus, the overheat and overcurrent protection circuits are able to perform stable protecting functions with high reliability.

When the switching signal received by the input terminal 61 is an OFF signal having a low (L) level, the transistor 65 is turned off, and the transistor 66 is turned on, so that the IGBT 16 is brought into an OFF state. As a result, a current path is established which extends from the gate of the IGBT 16 to the emitter, through the inductance 68, transistor 66, inductance 85 of the power ground 67, and the P-GND terminal 51, and transient current flows through this current path when charge stored between the gate and emitter of the IGBT 16 is discharged. In this case, too, the transient current is kept from flowing through the sense ground 76, and thus has no influence on the operations of the overheat and overcurrent protection circuits.

When the overheat protection circuit or overcurrent protection circuit detects overheat or overcurrent in the IGBT 16, the AND gate 63 is forced to supply only a low-level (L) signal to the predriver 64, so that the IGBT 16 can be surely turned off.

Next, there will be described the case where a plurality of drive circuits share one dc power supply. Here, two sets of drive circuits located on the negative side of a two-phase circuit portion as surrounded by the broken line in FIG. 1 operate in the following manner when the drive circuits are driven by one dc power supply 10d.

Figure 3:
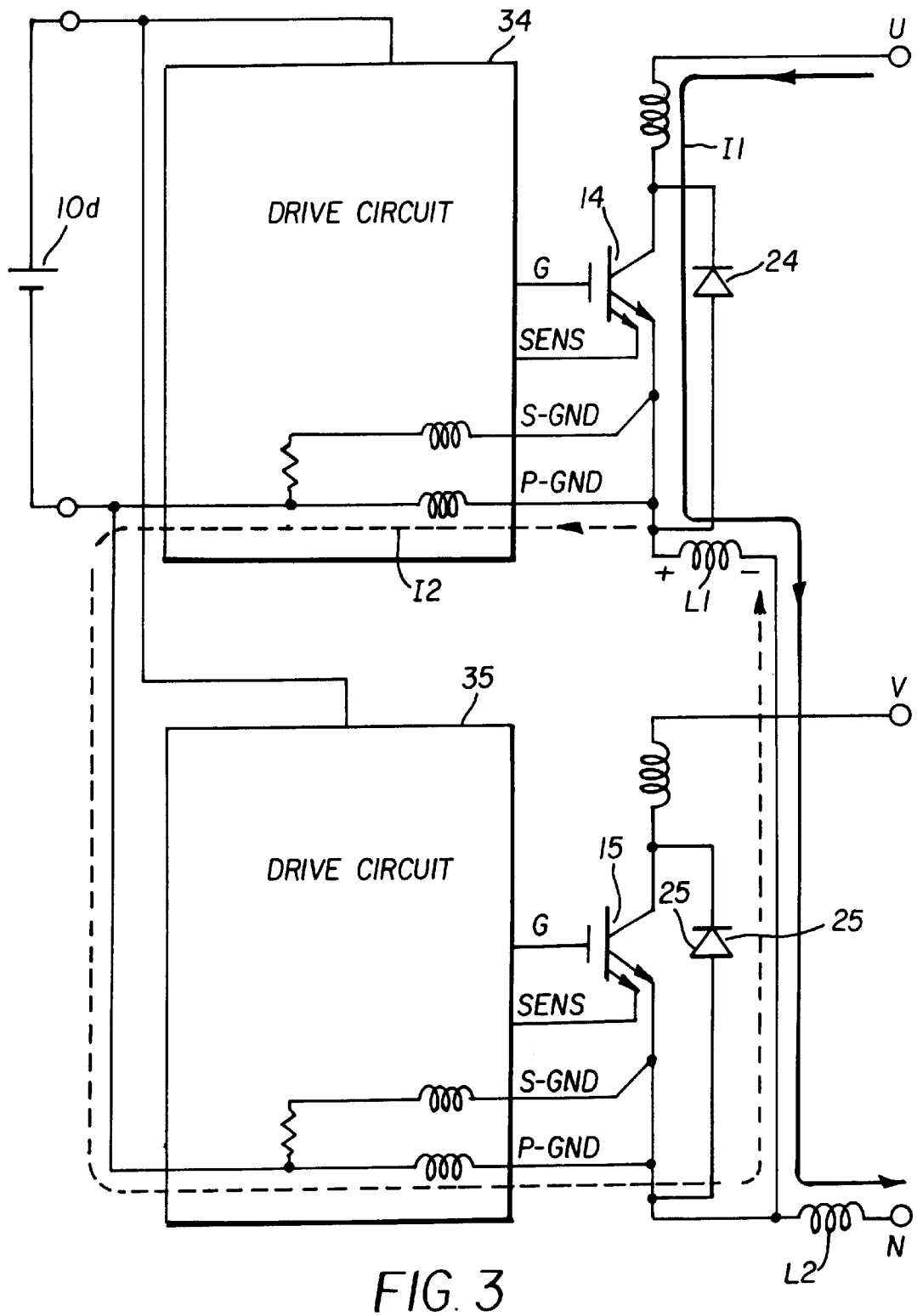
FIG. 3 is a view useful in explaining the operation of two sets of drive circuits when they use a common dc power supply.

FIG. 3 is a view useful in explaining the operations of two sets of drive circuits that share one dc power supply. As shown in FIG. 3, where two sets of drive circuits, i.e., drive circuit 34 and IGBT 14, and drive circuit 35 and IGBT 15, are connected to a single dc power supply 10d, an interphase inductance L1 exists in a wire between the emitter of the IGBT 14 and the adjacent IGBT 15, and an inductance L2 exists in a wire that leads to the terminal N. The interface inductance L1 lies on a loop-like current path in which current passes through the power ground P-GND of the drive circuit 34, a wire provided on the negative side of the dc power supply 10d, and the power ground P-GND of the drive circuit 35.

When the IGBT 14 is turned on, main current I1 flows through the inductances L1, L2. As a result, transient voltages are produced across the inductances L1, L2. In particular, the voltage produced across the interphase inductance L1 causes transient circulation current I2 to flow through the loop-like path including the power grounds P-GND of the drive circuits 34, 35. The circulation current I2 flows only through the power grounds P-GND, and does not flow through the sense grounds S-GND. When the IGBT 14 is turned off, on the other hand, negative transient voltages are produced across the inductances L1, L2. In this case, too, the transient voltage across the inductance L1 causes transient circulation current (−I2) to flow in the reverse direction along the loop-like current path, but this current (−I2) flows only through the power grounds P-GND, and is kept from flowing through the sense grounds S-GND that are used by the overheat protection circuits and overcurrent protection circuits.

With the above arrangement in which the sense grounds S-GND of the drive circuits 34, 35 are isolated from the power grounds P-GND thereof, even if transient voltage appears across the interphase lead inductance L1 upon turn-on or turn-off of the IGBT 14, the transient voltage does not cause any change in the operating points of the protection circuits of the individual drive circuits 34, 35, thus assuring stable protecting operations of these circuits.

Figure 4:
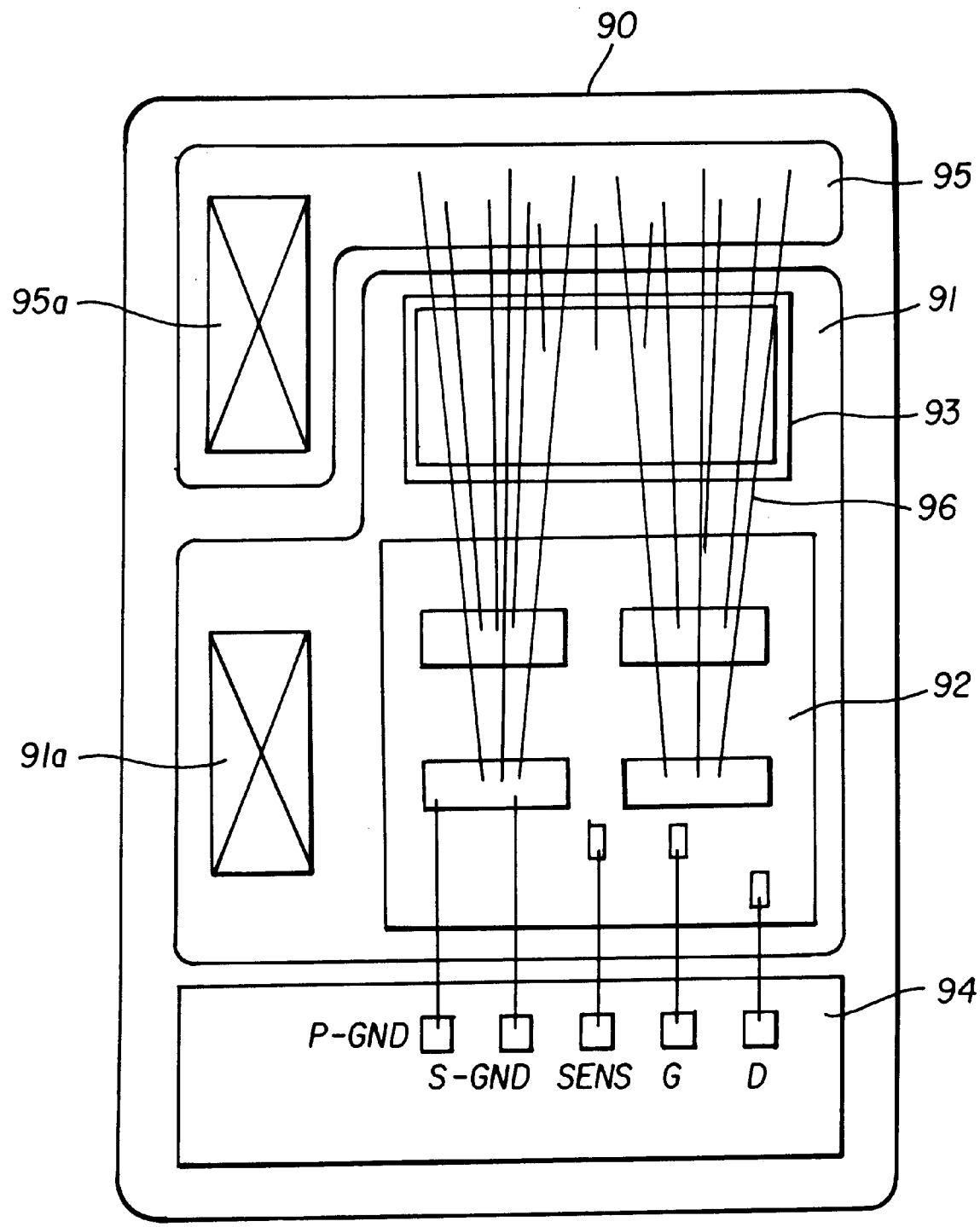
FIG. 4 is a view showing an example of IGBT-IPM on which some chips are mounted.
Figure 5:
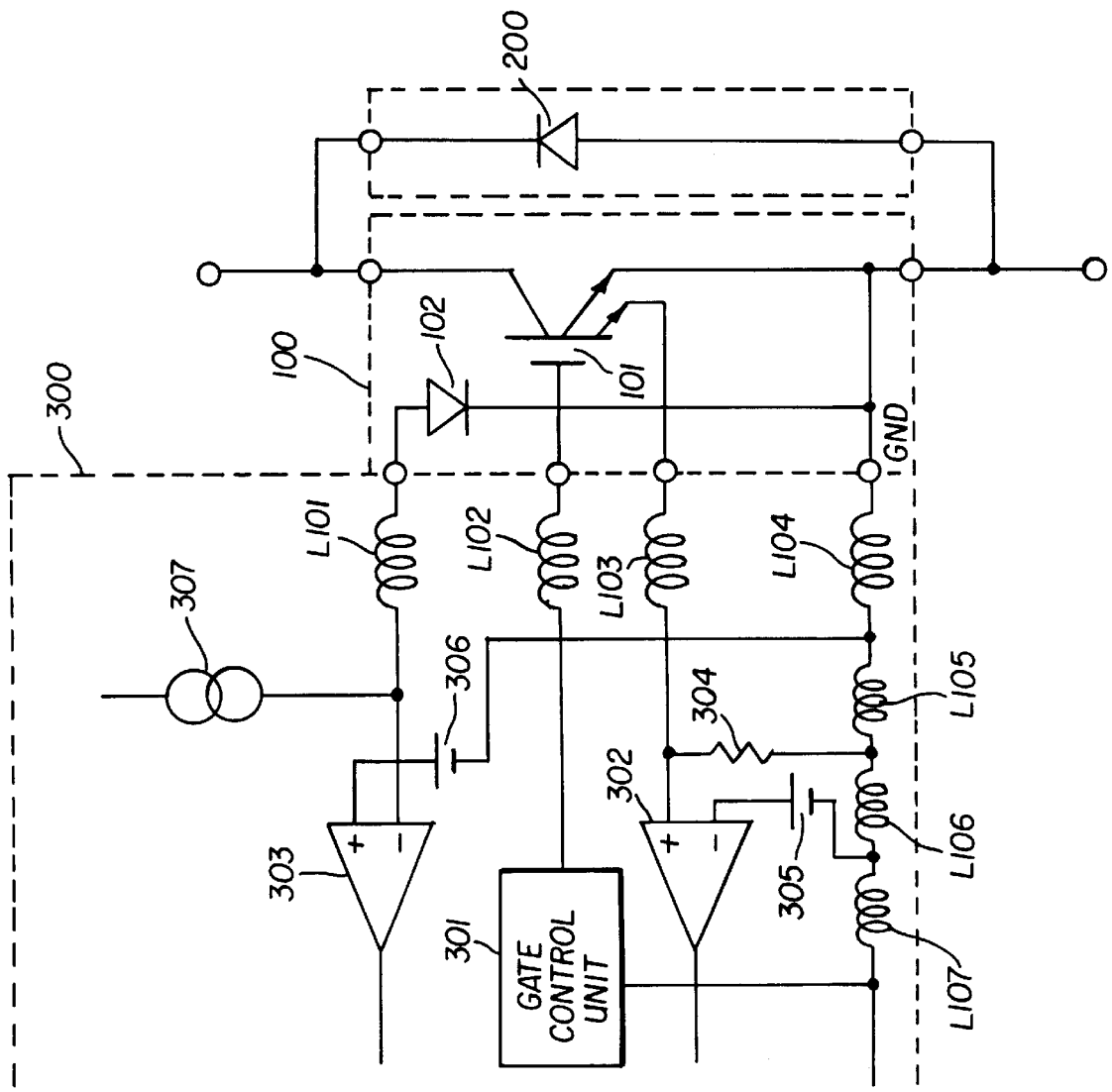
FIG. 5 is a circuit diagram showing a known drive circuit for IGBT that incorporates protection networks.
Figure 6:
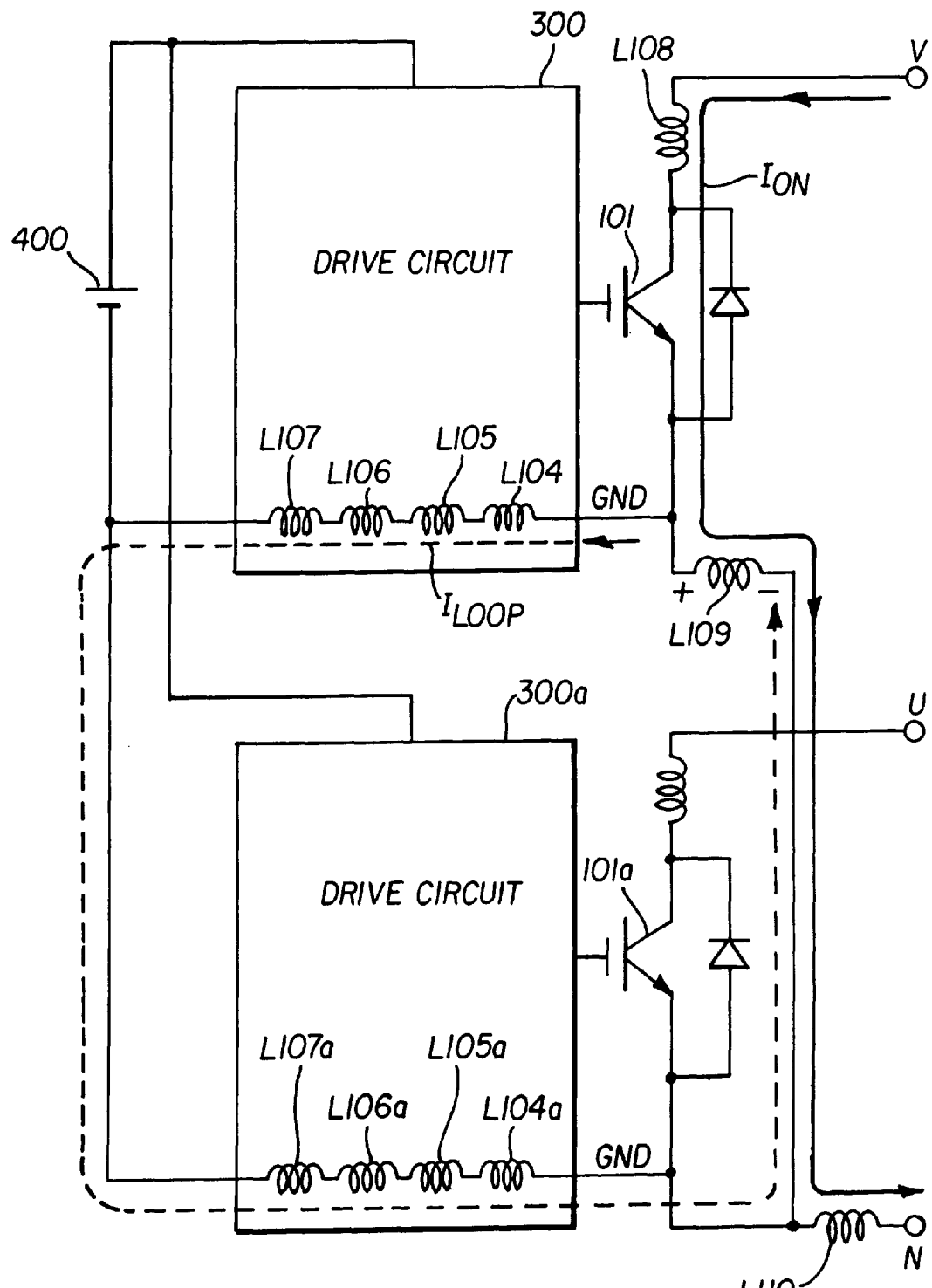
FIG. 6 is a view showing an example of connection of two drive circuits that use a common power supply.
Figure 7:
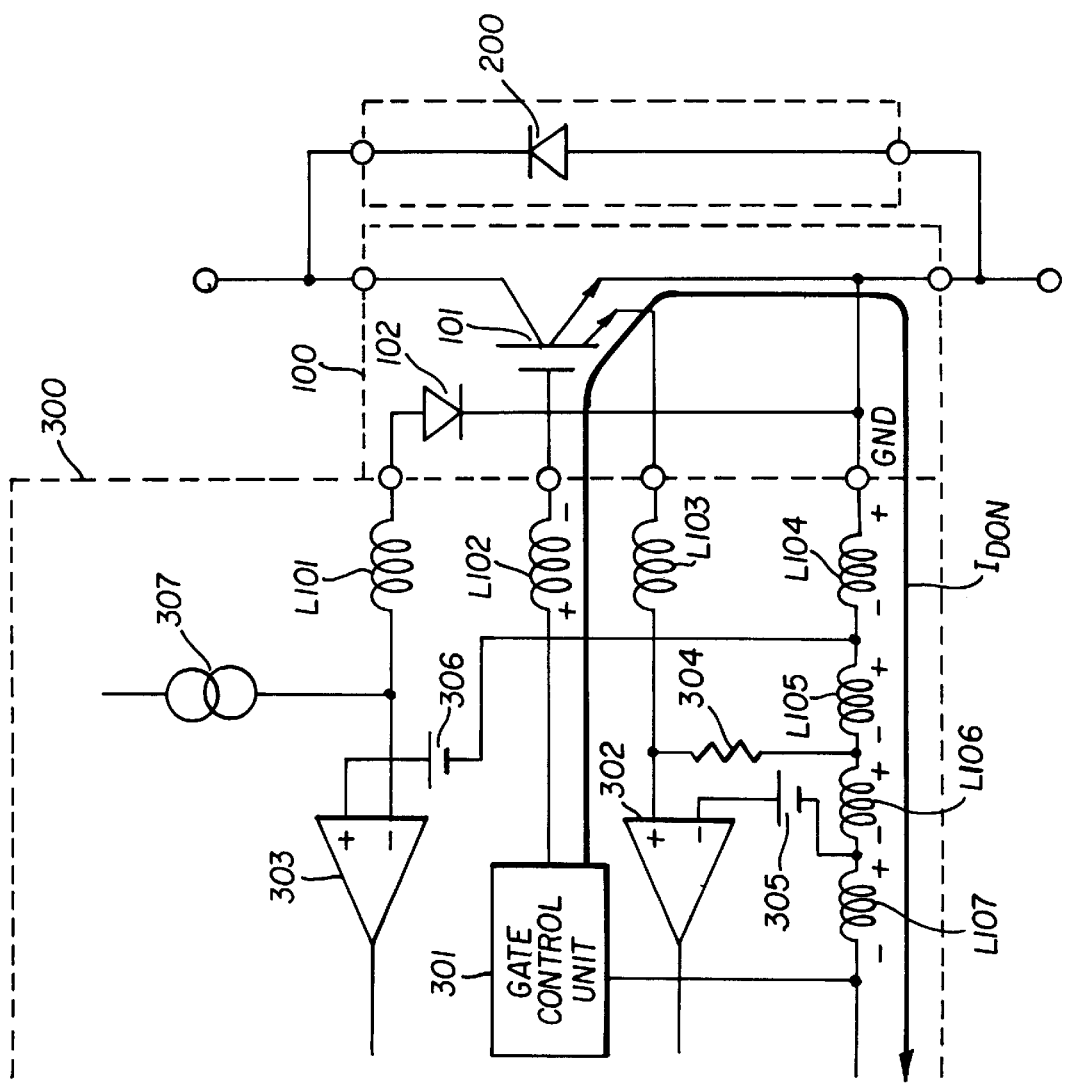
FIG. 7 is a view useful in explaining flow of drive current upon turn-on of the IGBT.
Figure 8:
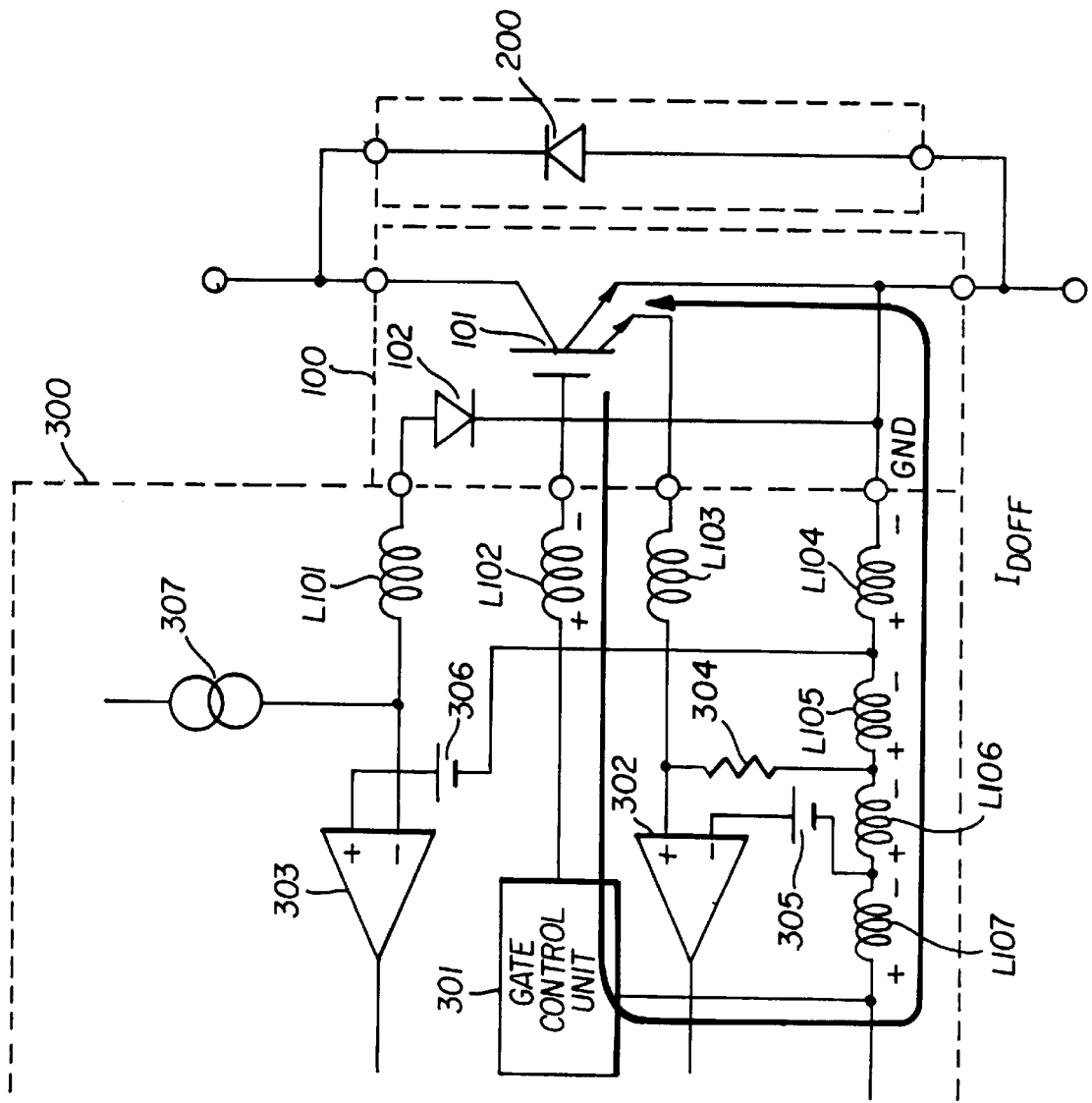
FIG. 8 is a view useful in explaining flow of drive current upon turn-off of the IGBT.

FIG. 4 is a view showing an example of IGBT-IPM on which some chips are mounted. In the IGBT-IPM as illustrated in FIG. 4, one drive circuit, one IGBT, and one flywheel diode are integrated together within one module. In the IGBT-IPM, an IGBT chip 92 and a diode chip 93 are mounted on the upper surface of a ceramic substrate 90 through a collector circuit pattern 91, and a driver chip 94 on which the drive circuit is integrated is mounted adjacent to the circuit pattern 91. Also, a collector terminal mounting portion 91a is provided on the collector circuit pattern 91. An emitter circuit pattern 95 is located adjacent to the collector circuit pattern 91, and an emitter terminal mounting portion 95a is provided on a part of the emitter circuit pattern 95.

The emitter terminal of the IGBT chip 92 is electrically connected to the emitter circuit pattern 95 by means of a plurality of bonding wires 96, and the anode terminal of the diode chip 93 is also connected to the emitter circuit pattern 95 by means of a plurality of bonding wires 96. In the driver chip 94, the D terminal for the temperature detection diode, G terminal connected to the gate of the IGBT, and the SENS terminal that receives sense current of the IGBT are connected to the corresponding terminals of the IGBT chip 92 through respective bonding wires, and the S-GND terminal for the sense ground and the P-GND terminal for the power ground are connected to mutually spaced or different points of the emitter region of the IGBT chip 92 through respective bonding wires.

With the above arrangement in which the S-GND terminal for the sense ground and the P-GND terminal for the power ground are taken from different positions of the emitter terminal of the IGBT chip 92, separate lines are established for the sense ground to be used by the protection circuits, and the power ground through which IGBT drive current flows. Even where one inverter circuit is constituted by a plurality of IGBT-IPM as described above, a loop circuit including the power ground of the IGBT-IPM can be formed independently of or separately from the sense ground. With this arrangement, no influence on the operations of the protection circuits results from transient voltages produced across inductances of internal wires due to transient current upon turn-on or turn-off of the IGBT.

While the power device takes the form of IGBT in the illustrated embodiments of the present invention, the present invention may be equally applied to circuits for driving other types of power devices, such as bipolar transistor and power MOSFET.

While the power device as described above is of N channel, the present invention may be equally applied to drive circuits for P-channel power devices. In this case, a common power supply is provided on the side of the P terminals of the drive circuits.

According to the present invention as explained above, the drive circuit for driving the power circuit includes two separate or independent grounds, namely, a ground through which the drive current flow, and a ground that is used by the protection circuit(s). With this arrangement, even if transient current, such as drive current, flows, the path of such transient current does not include the ground of the protection circuit that normally handles very small current, and therefore the protection current is prevented from malfunctioning due to the transient current, thus assuring stable protecting operations. Where a plurality of drive circuits use a common dc power supply, circulation current flows due to transient voltage that is created by the main current, across inductance between adjacent ones of a plurality of power devices. The circulation current is also kept from flowing into the ground of the protection current, thus avoiding malfunction of the protection circuit due to the circulation current.

What is claimed is:

1. A drive circuit for driving a power device, comprising:
   a first ground connected to an output of the power device, wherein the first ground provides a current path of drive current that flows when the drive circuit drives the power device;
   a second ground connected to the output of the power device, wherein the second ground is also coupled to a protection circuit that monitors an operating state of the power device; and
   an impedance through which said second ground is connected to said first ground, wherein the connection of said second ground to said first ground through said impedance forms a closed loop.

2. A drive circuit for driving a power device according to claim 1, wherein said second ground includes a wiring pattern to which said protection circuit is connected, and wherein said wiring pattern being located between a first position at which the second ground is connected to the power device and a second position at which the second ground is connected to the first ground through said impedance.

3. A drive circuit for driving a power device according to claim 1, wherein said protection circuit monitors the operating state of the power device, and prevents the flow of the drive current when the protection circuit detects an abnormality of the power device.

4. A drive circuit for driving a power device according to claim 1, wherein said protection circuit comprises an overcurrent protection circuit that prevents the flow of the drive current when detecting overcurrent of the power device.

5. A drive circuit for driving a power device according to claim 1, wherein said protection circuit comprises an overheat protection circuit that prevents the flow of the drive current null when detecting overheat of the power device.

6. A drive circuit for driving a power device according to claim 1, further comprising a switching element connected to a control terminal of the power device, wherein the switching element controls the power device by on/off operation thereof.

* * * * *